United States Patent [19]

Bynum

[11] Patent Number: 4,580,069

[45] Date of Patent: Apr. 1, 1986

[54] COMPARATOR

[75] Inventor: Byron G. Bynum, Tempe, Ariz.

[73] Assignee: Motorola, Inc., Schaumburg, Ill.

[21] Appl. No.: 229,482

[22] Filed: Jan. 29, 1981

[51] Int. Cl.[4] .......................................... H03K 5/153
[52] U.S. Cl. .................................. 307/350; 307/310; 307/363
[58] Field of Search ............... 307/297, 350, 354, 362, 307/363, 364, 310

[56] References Cited

U.S. PATENT DOCUMENTS 3,585,511  6/1971  Schatter et al. ..................... 307/350
4,061,959 12/1977  Ahmed ................................ 307/297

Primary Examiner—John Zazworsky
Attorney, Agent, or Firm—William E. Koch

[57] ABSTRACT

A comparator circuit cell has an output which switches between first and second states when an input voltage (or current) reaches a controlled trip point having a controllable positive, zero or negative temperature coefficient. First and second common emitter transistors are forced to operate at different emitter current densities at the trip point thus requiring the operation of a $\Delta V_{BE}$ across a first resistor coupled between the bases of the first and second transistors in order to get the circuit output to switch. The positive temperature coefficient current which flows through the first resistor to generate $\Delta V_{BE}$ is summed at the base of the second transistor with a negative temperature coefficient current flowing through a second resistor. This creates a required input current having a controllable magnitude and temperature coefficient. The input current may be provided through an additional resistor to the base of the second transistor to create a voltage input trip point having a controllable magnitude and temperature coefficient.

15 Claims, 2 Drawing Figures

COMPARATOR

BACKGROUND OF THE INVENTION

1. Field of the Invention

This invention relates generally to comparator circuits and, more particularly, to a circuit having an output which switches between first and second states when an input voltage (or current) reaches a controlled trip point having a controllable positive, zero or negative temperature coefficient.

2. Description of the Prior Art

It is often necessary to monitor an input voltage (or current) to determine if and when it reaches a predetermined value. For example, the output voltage of an automotive battery is monitored in order to determine when the alternator must be turned on. That is, if the battery voltage is too low, the alternator must be turned on to recharge the battery. When the battery voltage exceeds a predetermined value, the alternator must be turned off. Prior art arrangements which perform the required monitoring function are generally inflexible with respect to both the location (amplitude) of the trip point and the amount and sense of its temperature coefficient.

It may be necessary to monitor an input voltage (or current) to determine when two or more trip points have been reached. Again using an automotive battery as an example, it may be necessary to generate a low voltage warning at a first trip point, to regulate the battery output at a second higher voltage, and to generate a high voltage warning at a still higher voltage. A prior art approach would be to construct a voltage reference circuit circuit from which a plurality of trip points are derived which are in turn applied to a plurality of traditional comparators which are monitoring the input voltage. This approach is not only cumbersome, but also renders the assignment of specific temperature coefficients to the trip points rather difficult.

One known circuit which provides for the generation of a temperature coefficient which may be varied from $dV_{BE}/dt$ (a negative number) to some positive value is described in U.S. Pat. No. 3,887,863. This circuit offers some flexibility with respect to the positive temperature coefficient, but not with respect to the negative temperature coefficient.

SUMMARY OF THE INVENTION

It is an object of the present invention to provide an improved circuit for determining when an input voltage or current reaches a predetermined trip point.

It is a further object of the present invention to provide a circuit for determining when an input voltage or current reaches a controlled trip point having a controllable positive, zero or negative temperature coefficient which is independent of trip point level.

It is still a further object of the present invention to provide an improved voltage or current comparator circuit which may be easily expanded to provide a plurality of trip points each having an independently controlled temperature coefficient.

Still another object of the present invention is to provide an improved voltage or current comparator circuit which may be easily expanded to monitor different voltages (or currents) having independently controlled trip points and independently controllable temperature coefficients.

Finally, it is an object of the present invention to provide an improved circuit for generating a reference voltage, the amplitude and temperature coefficient of which are completely controllable without resort to external precision components.

According to a first aspect of the invention there is provided a circuit having an output which switches between first and second states when an input signal reaches a predetermined trip point, comprising: first means responsive to a first current for establishing a first reference voltage; second means coupled to said first means and to said output for establishing a second voltage sense level, said second voltage sense level being less than said first reference voltage by a predetermined amount; and third means coupled between said first and second means and responsive to said input signal for generating a voltage at said trip point corresponding to said predetermined amount so as to enable said output to switch between said first and second states.

According to a further aspect of the invention there is provided a comparator circuit having an output which switches between first and second states when an input signal reaches a predetermined trip point, comprising: a first current source for generating a first current; a first transistor having a base, emitter and collector, said collector being coupled to said first current source and said emitter being coupled to a first supply voltage terminal, said first transistor establishing a first reference base-emitter voltage thereacross; a second transistor having a base emitter and collector, said collector coupled to said output, and said emitter coupled to said first supply voltage terminal, said second transistor for establishing a second base-emitter voltage sense level thereacross; a second current source coupled between a second supply voltage terminal and the collector of said second transistor for supplying current thereto; and a first resistor coupled between the base of said first transistor and the base of said second transistor for receiving a predetermined portion of an input current and establishing thereacross a voltage having, at said trip point, a magnitude equal to the difference between the reference base-emitter voltage of said first transistor and the base-emitter voltage sense level of said second transistor.

According to a still further aspect of the invention there is provided a circuit having an output which switches between first and second states when an input signal reaches a predetermined trip point, comprising: first means responsive to a first current for establishing a first reference voltage; second means coupled to said first means and to said output for establishing a second voltage sense level which is less than said first reference voltage by a predetermined amount; third means coupled between said first and second means and responsive to said input signal for generating a voltage at said trip point corresponding to said predetermined amount so as to enable said output to switch between said first and second states; and fourth means coupled to said second and third means for increasing said second voltage sense level.

The above and other objects, features and advantages of the present invention will be more clearly understood from the following detailed description taken in conjunction with the accompanying drawings, in which:

DESCRIPTION OF THE PREFERRED EMBODIMENT

Figure 1:
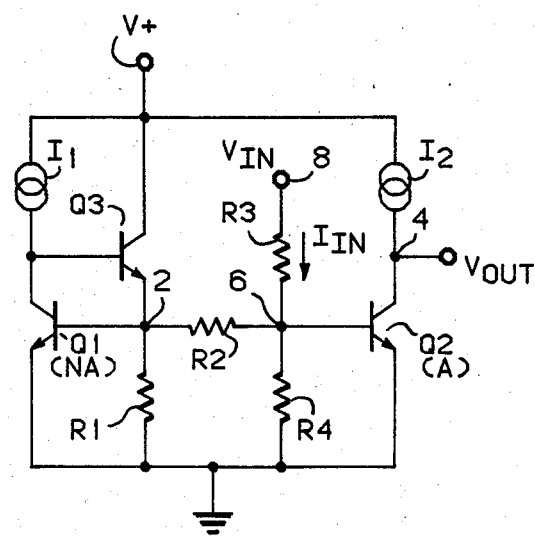
FIG. 1 is a schematic diagram of the inventive circuit.

FIG. 1 is a schematic diagram of the inventive circuit. As can be seen, the circuit includes first and second current sources $I_1$ and $I_2$ each having a first terminal coupled to a source of supply voltage (V+). The second terminal of current source $I_1$ is coupled to the base of transistor Q3 and to the collector of transistor Q1 which has an emitter area NA where A represents a reference area and N is greater than 1. The base of transistor Q1 is coupled to node 2 as is the emitter of transistor Q3 and one end of resistor R1. A reference voltage is produced at node 2. The collector of transistor Q3 is coupled to a first supply voltage terminal (V+) and the other end of resistor R1 is coupled to the emitter of transistor Q1. Transistor Q2 having an emitter area A has a collector coupled to the second terminal of current source $I_2$, an emitter coupled to the emitter of transistor Q1 and to a second supply voltage terminal (e.g. ground), and a base coupled to node 6 at which a voltage sense level is produced. A resistor R4 has a first end coupled to node 6 and a second end coupled to the emitters of transistors Q1 and Q2. A resistor R3 is coupled between node 6 and a source of an input voltage ($V_{in}$) at terminal 8. A resistor R2 is coupled between node 2 and 6, and the output of the circuit ($V_{out}$) is taken from node 4 which is coupled to the collector of transistor Q2.

Current $I_2$ being generated by current source $I_2$ is applied to the collector of transistor Q2. If Q2 is biased to sink more current than is being generated by current source $I_2$, then transistor Q2 will go into saturation and the voltage at node 4 ($V_{out}$) will go low. If, on the other hand, transistor Q2 does not sink all of $I_2$, the voltage at node 4 will rise.

For the sake of explaining the operation of the inventive circuit shown in FIG. 1, it will be assumed that current $I_1$ equals current $I_2$ although it will be understood that the circuit does not depend on this restriction for its operation. Since the emitter area of transistor Q1 is greater than that of transistor Q2, the base-to-emitter voltage of transistor Q2 ($V_{BEQ2}$) is greater than the reference base-to-emitter voltage ($V_{BEQ1}$) for equal emitter currents. In the absence of an input current $I_{in}$, the base-to-emitter voltage of transistor Q2 is biased solely from the base-to-emitter voltage of transistor Q1 through resistor R2. Therefore, in order to enable transistor Q2 to sink all the current being generated by current source $I_2$, some current must be driven through resistor R2. That is, the difference in base-to-emitter voltage between transistors Q1 and Q2 ($\Delta V_{BE}$) must be developed across resistor R2 in order to get the voltage at output node 4 to switch. This is accomplished as follows. The input voltage ($V_{in}$) at terminal 8 establishes an input current ($I_{in}$) through resistor R3 the bulk of which flows through resistors R2 and R4 since transistor Q2 is active and takes litle base current. Resistor R1 must have enough sink capability to sink the current flowing through R2 so as to prevent transistor Q3 from turning off and Q1 from going into saturation. Transistor Q1, and therefore Q3, must always be operating in the active region to provide the correct reference voltage $V_{BEQ1}$.

The collector current of transistor Q2 will be less than current $I_2$ until the required $\Delta VBE$ is developed across resistor R2. As the input voltage ($V_{in}$) increases, $V_{BEQ2}$ will increase due to the voltage increase across R2 and Q2 will start sinking more current. The output node 4 will switch from a high to a low state when transistor Q2 sinks all of $I_2$, after which point transistor Q2 will go into saturation.

Ignoring resistor R4 for the moment, the input voltage trip point may be defined as follows:

$$V_{in(trip)} = V_{BEQ2} + \Delta V_{BE}(R3/R2)$$

The $V_{BEQ2}$ term has a negative temperature coefficient and the $\Delta V_{BE}$ term has a positive temperature coefficient. Therefore, the input voltage ($V_{in}$) can be made to have a zero temperature coefficient trip point by proper selection of R3/R2. It should be noted that selection of R3/R2 to achieve zero temperature coefficient also defines a corresponding distinct value for $V_{in(trip)}$, nominally 1.23 volts.

To achieve flexibility in setting other trip points with independently controlled temperature coefficients, resistor R4 is added. Now, the input voltage trip point is defined as follows:

$$V_{in(trip)} = V_{BEQ2} + \Delta V_{BE}(R3/R2) + V_{BEQ2}(R3/R2)$$

That is $$V_{in(trip)} = V_{BEQ2}(1 + R3/R4) + \Delta V_{BE}(R3/R2)$$

The second term of the above equation is the positive temperature coefficient term, and the first term in the above equation represents the negative temperature coefficient term. It will be recalled that one of the objects of the invention was to produce a voltage reference the amplitude and temperature coefficient of which may be varied. By introducing resistor R4 into the circuit, additional base-emitter voltage is added permitting a zero temperature coefficient trip point at higher input trip voltages and, by varying resistors R2 and R4, any desired positive, zero, or negative temperature coefficient may be achieved.

The circuit shown in FIG. 1 has several very important and valuable characteristics. First, since node 6 is in reality a current summing junction, the circuit could be used to sense an applied current rather than an applied voltage by merely supplying the applied current to node 6. In this case, the current trip point would be defined as follows:

$$I_{in(trip)} = V_{BEQ2}/R4 + \Delta V_{BE}/R2$$

Second, the trip point can be manipulated by merely adding or subtracting current at node 6. For example, if current were added to node 6, less current would have to be supplied through resistor R3 and the trip point would decrease. Thus, the trip point may be modulated into accordance with any current function supplied to node 6. Third, the circuit could easily be converted to a voltage regulator by simply adding a transistor having a collector coupled to V+, a base coupled to node 4 and an emitter coupled to the $V_{in}$ terminal 8. Fourth, the circuit may be very easily expanded to provide for additional trip points or for the purpose of monitoring different input volages or currents as will be described below.

Figure 2:
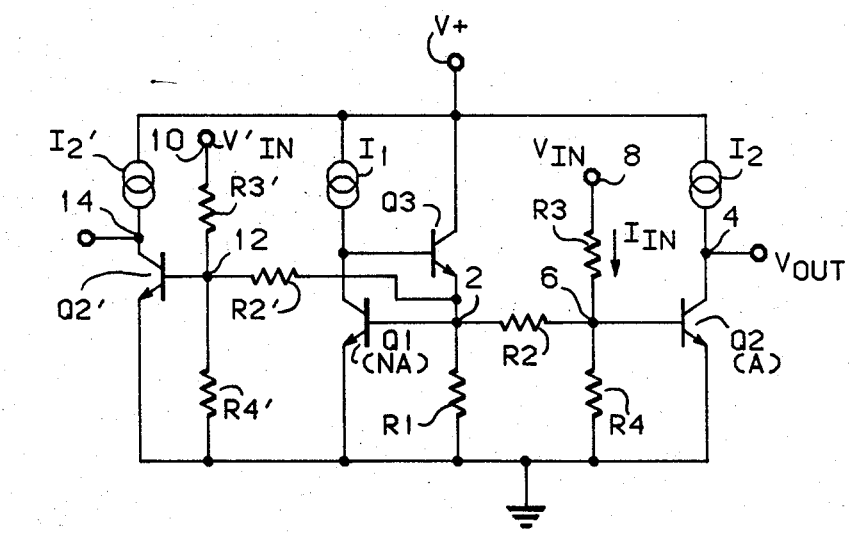
FIG. 2 illustrates how the circuit may be expanded to provide for additional trip points or to monitor different voltages (or currents).

FIG. 2 is a schematic diagram illustrating how the circuit of FIG. 1 can be expanded to provide either an additional trip point or for the purpose of monitoring a different input voltage or current. While only one additional stage has been added for the purpose of explaining the invention, it will be clear to the skilled practitioner that many additional stages could be added for the purpose of providing a plurality of trip points or for the purpose of monitoring a plurality of input voltages or input currents. Since the voltage at node 2 is essentially constant, it may be used as a common reference voltage to fan out to additional comparator stages one of which is shown in FIG. 2. Coupled between node 2 and node 12 is a resistor R2'. An additional current source I₂' is coupled between a source of supply voltage (V+) and the collector of an additional transistor Q2' the base of which is coupled to node 12 and the emitter of which is coupled to the emitters of transistors Q1 and Q2. A resistor R4' is coupled between node 12 and the emitter of transistor Q2, and a resistor R3' is coupled between node 12 and a voltage input terminal 10. The output of the additional stage is taken from the collector of transistor Q2' at node 14. This additional stage can monitor an input voltage $V_{in'}$ which is completely independent of $V_{in}$. Furthermore, if terminals 8 and 10 were coupled together, a second trip point could be obtained by properly scaling the resistors. Temperature coefficients of each of the trip points may be independently controlled. For example, keeping resistor R2 equal to R2' and resistor R4 equal to R4', the first and second trip points can be controlled by merely varying R3 and R3'. Thus, the circuit shown in FIG. 1 can be easily expanded resulting in multiple trip points.

The above description is given by way of example only. Changes in form and detail may be made by one skilled in the art without departing from the scope of the invention.

I claim:

1. A circuit having an output which switches between first and second states when an input signal reaches a predetermined trip point, comprising:
   first means responsive to a first current for establishing a first voltage;
   second means coupled to said first means and to said output for establishing a second voltage, said second voltage being greater than said first voltage by a predetermined amount; and
   third means coupled between said first and second means and responsive to said input signal for generating a voltage at said trip point corresponding to said predetermined amount so as to enable said output to switch between said first and second states.

2. A circuit according to claim 1 further including fourth means coupled to said second and third means for increasing said predetermined trip point.

3. A circuit according to claim 2 wherein said second means comprises a first transistor having a base, emitter and collector, said base coupled to said third means, said emitter coupled to a first supply voltage terminal, and said collector coupled to said output; and
   a first current source coupled between a second supply voltage terminal and the collector of said first transistor for supplying second current thereto, said second voltage corresponding to the base-emitter voltage of said first transistor.

4. A circuit according to claim 3 wherein said first means comprises a second transistor having a base, emitter and collector, said emitter coupled to said first supply voltage terminal; and
   a second current source coupled between said second supply voltage terminal and the collector of said second transistor for supplying said first current thereto, said first voltage corresponding to the base-emitter volage of said second transistor.

5. A circuit according to claim 4 wherein said first means further comprises:
   a third transistor having a base coupled to the collector of said second transistor, a collector coupled to said second supply voltage terminal and an emitter coupled to the base of said second transistor; and
   a first resistor coupled between the base of said second transistor and said first supply voltage terminal.

6. A circuit according to claim 5 wherein said third means comprises a second resistor coupled between the base of said first transistor and the base of said second transistor forming a current summing node at the base of the first transistor, said current summing node receiving an input current corresponding to said input signal.

7. A circuit according to claim 6 further comprising a third resistor having one end coupled to said current summing node and having another end coupled to receive an input voltage signal thereby generating an input current through said third resistor and into said current summing node.

8. A circuit according to claim 7 wherein said fourth means comprises a fourth resistor coupled between said first voltage supply terminal and said current summing node.

9. A circuit according to claim 8 wherein said first transistor has an emitter of area A and said second transistor has an emitter area NA where N is greater than 1.

10. A circuit according to claim 9 wherein said first resistor is small enough to sink all current flowing through said second resistor thus placing a constant voltage on the base of said second transistor.

11. A comparator circuit having an output which switches between first and second states when an input signal reaches a predetermined trip point, comprising:
   a first current source for generating a first current;
   a first transistor having base, emitter, and collector, said collector being coupled to said first current source and said emitter being coupled to a first supply voltage terminal, said first transistor establishing a first base-emitter voltage thereacross;
   a second transistor having a base, emitter and collector, said collector coupled to said output, and said emitter coupled to said first supply voltage terminal, said second transistor for establishing a second base-emitter voltage thereacross;
   a second current source coupled between a second supply voltage terminal and the collector of said second transistor for supplying current thereto; and
   a first resistor coupled between the base of said first transistor and the base of said second transistor for receiving a predetermined portion of an input current and establishing thereacross a voltage having, at said trip point, a magnitude equal to the difference between the first base-emitter voltage of said first transistor and a second base-emitter voltage of said second transistor.

12. A comparator circuit according to claim 11 further including a second resistor coupled between said second transistor and said first supply voltage terminal for increasing the second base-emitter voltage.

13. A comparator circuit according to claim 12 further including a third resistor coupled to the base of said second transistor for receiving an input voltage and for generating said input current.

14. A comparator circuit according to claim 13 further including a fourth resistor coupled between the base of said first transistor and said first supply voltage terminal, said fourth resistor capable of sinking all current flowing through said first resistor.

15. A circuit having an output which switches between first and second states when an input signal reaches a predetermined trip point, comprising:

first means responsive to a first current for establishing a first voltage;

second means coupled to said first means and to said output for establishing a second voltage which is greater than said first voltage by a predetermined amount;

third means coupled between said first and second means and responsive to said input signal for generating a voltage at said trip point corresponding to said predetermined amount so as to enable said output to switch between said first and second states; and fourth means coupled to said second and third means for increasing said second voltage.

* * * * *